United States Patent [19]

Riedl

[11] Patent Number: 4,510,448
[45] Date of Patent: Apr. 9, 1985

[54] DEVICE FOR GENERATING IMAGES OF AN EXAMINATION SUBJECT

[75] Inventor: Hermann Riedl, Erlangen, Fed. Rep. of Germany

[73] Assignee: Siemens Aktiengesellschaft, Berlin & Munich, Fed. Rep. of Germany

[21] Appl. No.: 421,290

[22] Filed: Sep. 22, 1982

[30] Foreign Application Priority Data

Oct. 1, 1981 [DE] Fed. Rep. of Germany ....... 3139137

[51] Int. Cl.$^3$ ............................................. G01R 33/08
[52] U.S. Cl. ..................................... 324/309; 324/307
[58] Field of Search ............... 324/300, 307, 309, 311, 324/318

[56] References Cited

U.S. PATENT DOCUMENTS 4,322,684 3/1982 Hounsfield ......................... 324/309

Primary Examiner—Michael J. Tokar
Attorney, Agent, or Firm—Hill, Van Santen, Steadman & Simpson

[57] ABSTRACT

The disclosure relates to a device for generating images of an examination subject with nuclear magnetic resonance in which a coil system for applying magnetic fields to the examination subject and for detecting the excursion of the magnetic nuclear spins of the examination subject from their state of equilibrium due to a high frequency magnetic excitation pulse is provided. The coil system exhibits gradient coils which are fed by a control device and fix the position of the examined layer in the examination subject with reference to a three-dimensional coordinate system with an x-, y- and z-axis. The control device exhibits a first setting for the selection of the axis (x, y, z) of the coordinate system which lies in the examined plane, and exhibits a second setting for the selection of the inclination of the examined plane.

3 Claims, 3 Drawing Figures

DEVICE FOR GENERATING IMAGES OF AN EXAMINATION SUBJECT

BACKGROUND OF THE INVENTION

The invention relates to a device for generating images of an examination subject with nuclear magnetic resonance in which means exist for applying magnetic fields to the examination subject and for detecting the excursion of the nuclear spins of the examination subject from its state of equilibrium due to a high frequency excitation pulse, and in which the means for applying magnetic fields exhibit gradient coils which are supplied by a control device and establish the position of the examined layer in the examination subject with reference to a three-dimensional coordinate system with the x-, y-, and z-axis.

Given a device of this type, the fact is exploited that the atomic nuclei of specific elements, particularly of hydrogen, are aligned in a static magnetic field and can be subject to an excursion from their preferred direction by means of a high frequency excitation pulse (returning into said preferred direction after the end of the excitation pulse). During the return, they execute a precessional motion around the preferred position. The information thereby generated in a measuring coil has a frequency which depends on the magnetic flux density.

It is also possible to achieve a selected excitation of a specific layer of the examination subject in that one exploits the fact that a specific frequency is required for the excitation of atomic nuclei, said frequency depending on the magnetic flux density. When a field gradient is superimposed on the magnetic field for the alignment of the atomic nuclei, then the atomic nuclei in only a specific layer of the examination subject in which the magnetic flux density corresponds to the frequency of the excitation pulse are excited.

It is known that one can generate gradient vectors by means of a suitable disposition of gradient coils, said gradient vectors, as a result of linear combination, producing a desired (randomly selectable) oriented sum vector and, therewith, selecting any desired layer in the examination subject. However, a relatively large outlay in terms of electronics in the control device for the gradient coils is required for the selection of a layer lying at a desired location in the examination subject.

SUMMARY OF THE INVENTION

The object of the invention is to create a device at the type initially cited in which, given a sufficient possibility of variation in the selection of the examined layer of the examination subject, the outlay for the drive of the gradient coils is kept low.

This object is inventively achieved in that the control device exhibits first setting means for the selection of the axis of the coordinate system which lies in the examined plane and exhibits second setting means for the selection of the inclination of the examined plane. The inventive device foregoes the random selection of the examined plane. The examined layer always lies in a plane which proceeds through one of the three mutually perpendicular axes of a coordinate system. However, the inclination of this plane can be varied. In practice, the setting possibilities fixed in that manner suffice for the layer selection. Thereby, the control device can contain a computer which determines the required signals for the gradient coils from the values which have been set.

In the following, the invention is described in greater detail on the basis of an exemplary embodiment illustrated on the accompanying drawing sheet; and other objects, features and advantages will be apparent from this detailed disclosure and from the appended claims.

DETAILED DESCRIPTION

Figure 1A:
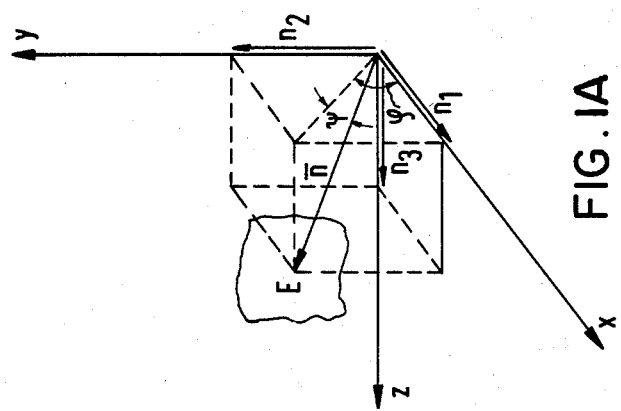
FIG. 1A is a diagrammatic illustration useful in explaining the teachings of the present invention.
Figure 1:
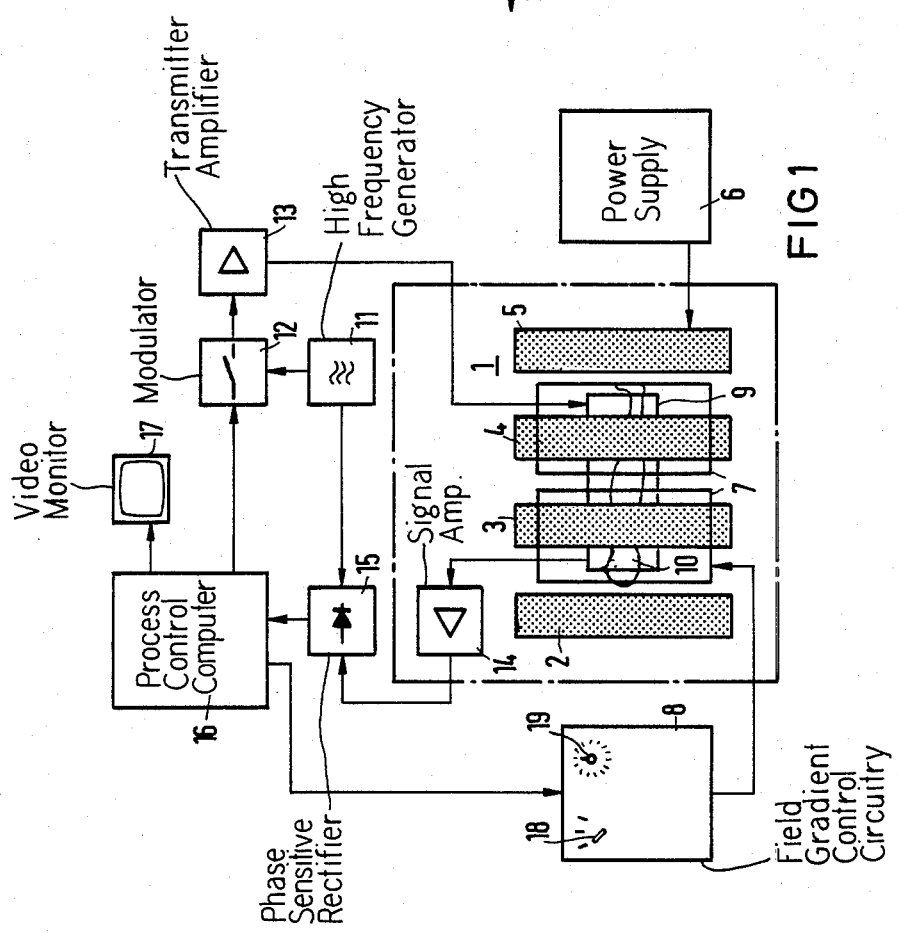
FIG. 1 shows an overall view of an inventive device.

Illustrated in FIG. 1 is a coil system 1 which exhibits four magnetic coils 2, 3, 4, 5 which are fed by a magnetic power pack 6 and generate a homogenous magnetic field in the Z-direction. Gradient coils 7 which are supplied by a control device 8 serve to generate a field gradient. On the basis of the generated field gradient, the nuclear resonance is only excited in a specific layer of a patient 10 lying within the coil system when a high frequency pulse is suppled to a high frequency coil 9. This is the case because a specific magnetic flux density is associated with each frequency of the excitation pulse and the excitation only ensues where this flux density likewise prevails. The excitation pulses are generated by a high frequency oscillator 11 and are supplied to the high frequency coil 9 via a modulator 12 and a transmitter amplifier 13.

After the end of an excitation pulse, the generated nuclear spins produce signals in the high frequency coil 9 which are supplied to a process control computer 16 via a signal amplifier 14 and a phase-sensitive rectifier 15. To this end, the phase-sensitive rectifier 15 is correspondingly activated by the high frequency oscillator 11 after the end of a high frequency pulse. On the basis of the generated field gradients, the read-out frequencies can be alloted to specific locations in the examined layer of the patient 10. When one changes the direction of the field gradients, then it is possible to calculate an image of the examined layer from the read-out signals with the assistance of the process control computer 16 and to reproduce the image on a monitor 17.

Given the illustrated device, the plane in which a respective layer of the patient 10 is examined is fixed in that it proceeds through one of the axes x, y or z. Thereby, the z-axis proceeds in the longitudinal direction of the opening in the coil system 1 in which the patient 10 lies, the y-axis proceeds perpendicularly thereto in the plane of the drawing, and the x-axis likewise proceeds perpendicularly thereto and perpendicularly to the plane of the drawing. In addition, it is also possible to adjust the inclination of the plane in which the examined layer lies by rotating it around its respective axis x, y or z. This is explained in greater detail below on the basis of FIG. 2.

Figure 2:
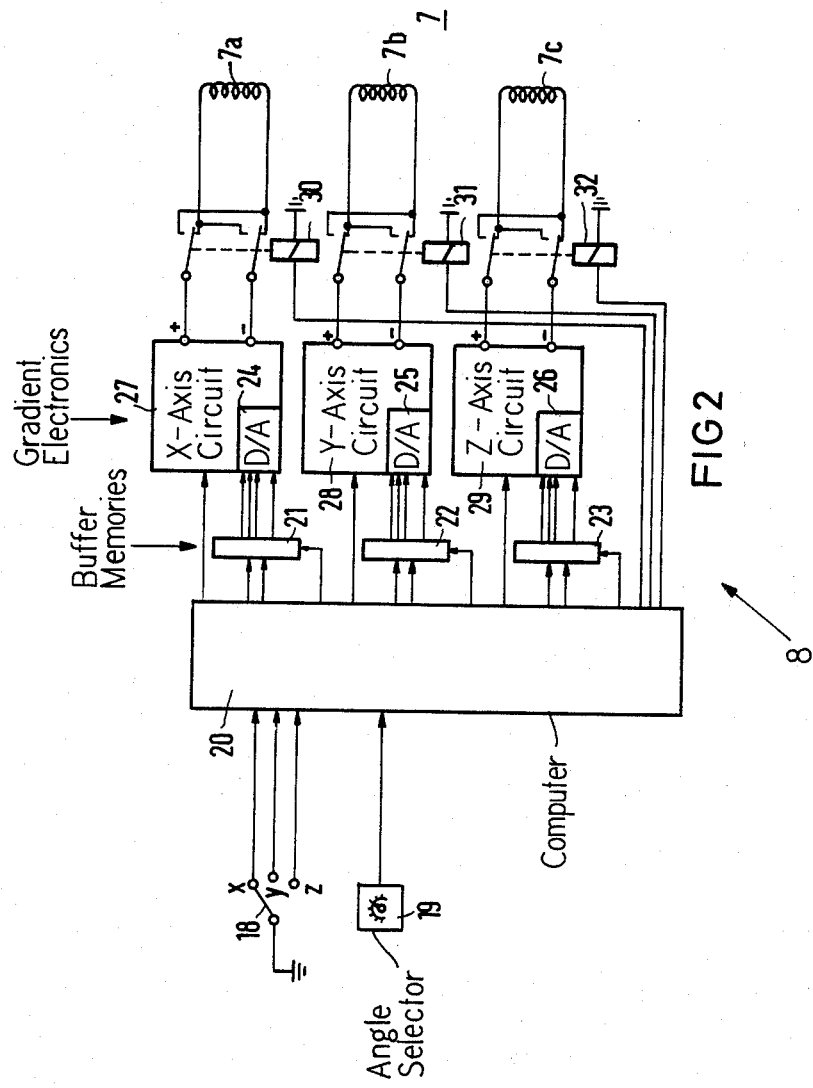
FIG. 2 shows a detail of the device according to FIG. 1.

A switch 18 is illustrated in FIG. 2 which allows the axis x, y or z through which the plane proceeds to be selected. Further, an angle selector 19 is present by means of which the selected plane can be rotated around its axis and, thus, its inclination can be set. Signals corresponding to the set values are supplied to a computer 20 which determines the signals therefrom which are to be supplied to the gradient coils 7 for the corresponding excitation and read-out. Thereby, the gradient coil 7a is allocated to the x-axis, the gradient coil 7b is allocated to the y-axis, and the gradient coil 7c is allocated to the z-axis.

The output signals of the computer 20 are supplied over buffer memories 21–23 to digital-to-analog converters 24, 25, 26 in the x-gradient electronics 27, in the y-gradient electronics 28, and in the z-gradient electronics 29. Suitable voltages are supplied to the electronics 27–29 for the supply of the gradient coils 7a, 7b, and 7c by means of said electronics 27–29 over commutation relays 30, 31, 32. The pole reversal signals are likewise supplied from the computer 20.

FIG. 2 shows an exact implementation of the gradient power supply 8. The setting of the inclination of the selected plane, and thus, of the examined layer of the patient 10 and the selection of the axis through which said plane shall extend proceeds therefrom. A simple structure of the gradient power supply 8 derives as a result of the limitation in the selectability of the plane in which the examined layer lies to one of three axes.

The following should be taken into consideration for programming the computer 20:

The transformation matrix for imaging the gradient factors $g_x$, $g_y$, $g_z$ into the gradient vectors $g_{e1}$, $g_{e2}$, $g_{e3}$, in a new ortho-normal system with the axes $e_1$, $e_2$, $e_3$ can be simplified by means of the following measures:

Fixing the angle to $\phi = \pm \pi/2$, i.e. cos $\phi = 0$, sin $\phi = \pm 1$. Given $$\bar{n} = \bar{e}_3 = \begin{pmatrix} 0 \\ \pm \cos\psi \\ \sin\Psi \end{pmatrix},$$

this means that only layer planes rotatable around the x-axis are admitted.

Exploitation of the fact that $\bar{n}$ and $-\bar{n}$ produce the same cutting plane. The images thus arising are side-reversed, but can be "turned around" by means of software.

Limitation of the value range for $\Psi$ to: $\pi/4 \leq \Psi \leq \pi/2$. Given the determination of $$\bar{e}_3 = \bar{n} = \begin{pmatrix} 0 \\ \pm \cos\psi \\ \sin\Psi \end{pmatrix},$$

this leads to the fact that $\bar{e}_3$ is directed in the z-direction with its principal component.

Permutation of the allocation between the $g_x$, $g_y$, and $g_z$ signals and the x, y and z gradient coils. Therewith obtainable is
(a) that the limitation of the value range for $\Psi$ is resolved (in the example selected up to now, $\bar{e}_3 \sim \bar{z}$, by means of expansion to $\bar{e}_3 \sim \bar{Y}$ a full 180° rotation of the cutting plane around the x-axis becomes possible).
(b) that the special position of the z-axis (given in the preceding examples) can also be transferred to the x- and y-axes. Therewith, the 180° rotation of the cutting plane is also possible around the y- or z-axis.

By means of inserting the values for $\phi = \pm \pi/2$ and with the angle $\Psi^* = |90° - \Psi|$, the transformation matrix is simplified to $$\begin{pmatrix} g_{e1} \\ g_{e2} \\ g_{e3} \end{pmatrix} = \begin{pmatrix} 1 & 0 & 0 \\ 0 & \cos\psi^* & \mp \sin\psi^* \\ 0 & \pm \sin\psi^* & \cos\psi^* \end{pmatrix} \cdot \begin{pmatrix} g_x \\ g_y \\ g_z \end{pmatrix}$$

Thereby, the angle $\Psi^*$ is always positive and, graphically is the angle between $\bar{z}$ and $\bar{e}_3$, whereby, given three-dimensional polar coordinates, $\Psi$ denotes the angle between $\bar{e}_3$ or $\bar{n}$ (FIG. 1A), and the x-y plane. The operational signs in the sin $\Psi^*$ values derive from $\phi = \pm \pi/2 \rightarrow \sin \phi = \pm 1$ Thereby, $\bar{n}$ is a normal vector which is perpendicular to the selected plane and which proceeds through the origin of the x, y, z coordinate system. The direction of $\bar{e}_1$ is expediently defined as the direction of the intersecting line between the selected plane and the x- and z-plane. Then $\bar{e}_2$ is determined by the demand for a positive orientation of the system $\bar{e}_1$, $\bar{e}_2$, $\bar{e}_3$.

An operational sign can be simplified for the angle $\Psi^*$ in that $\Psi^* > 0$ leads to positive and $\Psi^* < 0$ leads to negative y-components given $\bar{e}_3$. Thus, one obtains unequivocal conditions for the operational signs in the transformation matrix without having to have recourse to the significance of the angle $\phi$ which no longer appears:

$$\begin{pmatrix} g_{e1} \\ g_{e2} \\ g_{e3} \end{pmatrix} = \begin{pmatrix} 1 & 0 & 0 \\ 0 & \cos\psi^* & -\sin\psi^* \\ 0 & \sin\psi^* & \cos\psi^* \end{pmatrix} \cdot \begin{pmatrix} g_x \\ g_y \\ g_z \end{pmatrix}$$

or, respectively, in short notation $$G_e = T \cdot G_{xyz}$$

AXIAL PERMUTATIONS

Let the permutation $$\begin{pmatrix} g_x \\ g_y \\ g_z \end{pmatrix} \longrightarrow \begin{pmatrix} g_x \\ g_z \\ g_y \end{pmatrix}$$

be referred to in short notation as $\bar{G}_{xyz} \rightarrow \bar{G}_{xzy}$. Thus, the following possible cases derive:

I. ROTATION OF THE PLANE AROUND THE X-AXIS $$G_e = T \cdot G_{xyz}, \Psi^*: \sphericalangle(z \rightarrow e_3)$$

$$G_e = T \cdot G_{xzy}, \Psi^*: \sphericalangle(y \rightarrow e_3)$$

II. ROTATION OF THE PLANE AROUND THE Y-AXIS $$G_e = T \cdot G_{yxz}, \Psi^*: \sphericalangle(z \rightarrow e_3)$$

$$G_e = T \cdot G_{yzx}, \Psi^*: \sphericalangle(x \rightarrow e_3)$$

III. ROTATION OF THE PLANE AROUND THE Z-AXIS $$G_e = T \cdot G_{zxy}, \Psi^*: \sphericalangle(y \rightarrow e_3)$$

$$G_e = T \cdot G_{zyx}, \Psi^*: \sphericalangle(x \rightarrow e_3)$$

BOUNDARY CONDITIONS FOR METHODOLOGICAL PULSE SEQUENCES

The pulse sequences for the gradient fields for measuring image data are to be applied to the coordinate axes $e_1, e_2, e_3$. In order to avoid change-over operations in the technical gradient pulses $g_x$, $g_y$ and $g_z$ during such pulses, the following conditions can be read from the transformation matrix T:

- $g_{e1}$ can be chronologically randomly combined in a desired manner with the remaining gradients $g_{e2}$ and $g_{e3}$.
- $g_{e2}$ and $g_{e3}$ can only be combined when both are simultaneously switched on and off.

Given a suitable pulse pattern, images can also be generated given rotation of the cutting plane around the axes x, y, or z. One polarity suffices for this purpose in the gradient power supply whereby, however, a pole interchange must be undertaken by means of switch elements before specific pulses.

It will be apparent that many modifications and variations may be made without departing from the scope of the teachings and concepts of the present invention.

I claim as my invention:

1. Device for generating images of an examination subject with nuclear magnetic resonance in which means are present for applying magnetic fields to the examination subject and for detecting the excursion of the nuclear spins of the examination subject out of a state of equilibrium due to a high frequency magnetic excitation pulse and in which the means for applying magnetic fields comprises gradient coils, a control device for supplying the gradient coils and thereby establishing the position of the examined layer in the examination subject with reference to a three-dimensional coordinate system with a x-, y- and z-axis, characterized in that the control device comprises first setting means for the selection of the axis of the coordinate system which lies in the examined plane, and comprises second setting means for the selection of the inclination of the examined plane.

2. Device according to claim 1, characterized in that a computer is connected with the setting means for determining the signals to be supplied to the gradient coils.

3. Device according to claim 1, characterized in that the control device comprises electronic circuits for supplying the gradient coils and having only one output polarity, and polarity reversal devices for coupling the outputs of the electronic circuits with the gradient coils.

* * * * *